US012638590B2

(12) United States Patent
Bossart et al.

(10) Patent No.: US 12,638,590 B2
(45) Date of Patent: May 26, 2026

(54) METHOD AND DEVICE OF DISTANCE MEASUREMENT BY TIME-OF-FLIGHT CALCULATION WITH WRAPAROUND

(71) Applicants: STMICROELECTRONICS (BEIJING) R&D CO., LTD, Beijing (CN); STMicroelectronics (Grenoble 2) SAS, Grenoble (FR); STMICROELECTRONICS LTD., Kowloon (HK)

(72) Inventors: Etienne Bossart, Claix (FR); Ji Nan Li, Shenzhen (CN); Cedric Patrick Jean Claude Colombo, Hong Kong (CN); Thomas Perotto, Grenoble (FR)

(73) Assignees: STMICROELECTRONICS (BEIJING) R&D CO., LTD., Beijing (CN); STMicroelectronics (Grenoble 2) SAS, Grenoble (FR); STMICROELECTRONICS LTD, Kowloon (HK)

( * ) Notice: Subject to any disclaimer, the term of this patent is extended or adjusted under 35 U.S.C. 154(b) by 1017 days.

(21) Appl. No.: 17/655,118

(22) Filed: Mar. 16, 2022

(65) Prior Publication Data

US 2022/0308229 A1     Sep. 29, 2022

(30) Foreign Application Priority Data

Mar. 29, 2021     (FR) ...................................... 2103215

(51) Int. Cl.
    *G01S 17/894*        (2020.01)
    *G01S 7/48*          (2006.01)
    (Continued)

(52) U.S. Cl.
    CPC .......... *G01S 17/894* (2020.01); *G01S 7/4808* (2013.01); *G01S 7/4863* (2013.01); *G01S 13/227* (2013.01); *G01S 17/10* (2013.01); *H10F 30/225* (2025.01)

(58) Field of Classification Search
    CPC .... G01S 17/894; G01S 7/4808; G01S 7/4863; G01S 17/10; G01S 7/4865; G01S 7/497; G01S 13/227; G01S 17/08; H10F 30/225
    See application file for complete search history.

(56) References Cited

U.S. PATENT DOCUMENTS

| | | | |
|---|---|---|---|
| 10,094,915 B2 | 10/2018 | Drader et al. | |
| 2012/0257186 A1 | 10/2012 | Rieger et al. | |

(Continued)

FOREIGN PATENT DOCUMENTS

FR          3034513 A1      10/2016

*Primary Examiner* — Isam A Alsomiri
*Assistant Examiner* — Joseph C Fritchman
(74) *Attorney, Agent, or Firm* — Slater Matsil, LLP

(57) ABSTRACT

The present disclosure concerns a method of measuring the distance between a device and an object comprising the steps of determination of a first estimated distance based on the time of flight of first light pulses having a first period; determination of a second estimated distance based on the time of flight of second light pulses having a second period different from the first period; determination based on the interval between the first and second estimated distances of whether the device is in a wraparound area among wraparound areas; and if the device is in a wraparound area among wraparound areas, adding to the first estimated distance a compensation having its value depending on the wraparound area.

17 Claims, 5 Drawing Sheets

(51) Int. Cl.
    *G01S 7/4863*      (2020.01)
    *G01S 13/22*       (2006.01)
    *G01S 17/10*       (2020.01)
    *H10F 30/225*      (2025.01)

(56)              References Cited

U.S. PATENT DOCUMENTS

2016/0209498 A1*  7/2016  Kanter ................... G01S 7/487
2016/0291138 A1   10/2016 Drader et al.
2018/0011195 A1*  1/2018  Perry ..................... G06F 17/10
2019/0162851 A1   5/2019  Ullrich
2022/0206146 A1*  6/2022  Beer ..................... G01S 17/894
2023/0280691 A1*  9/2023  Smeeton .............. G01S 7/4814
                                                 359/1

* cited by examiner

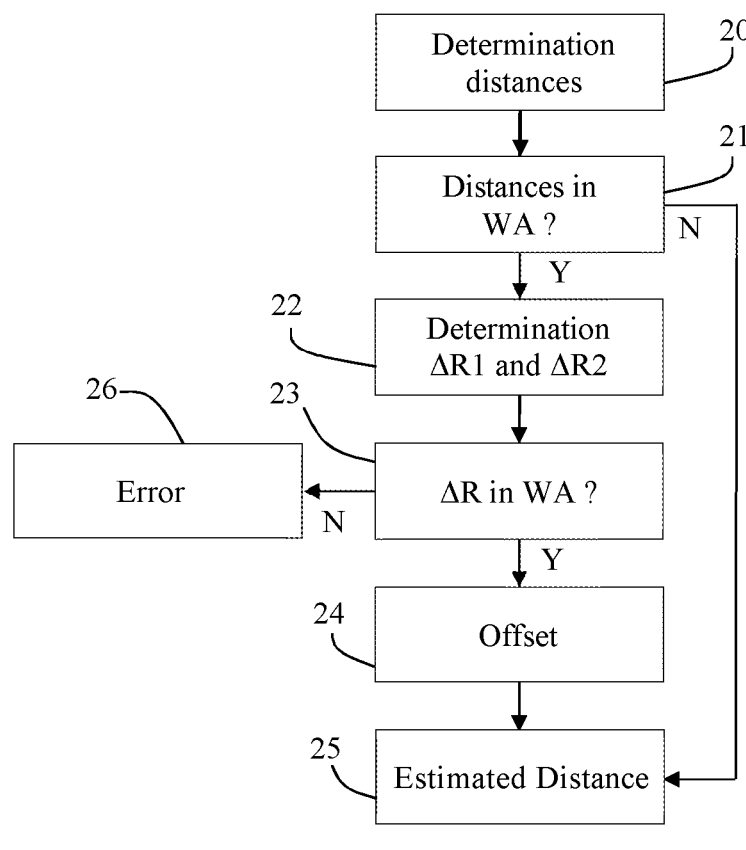
Fig 8
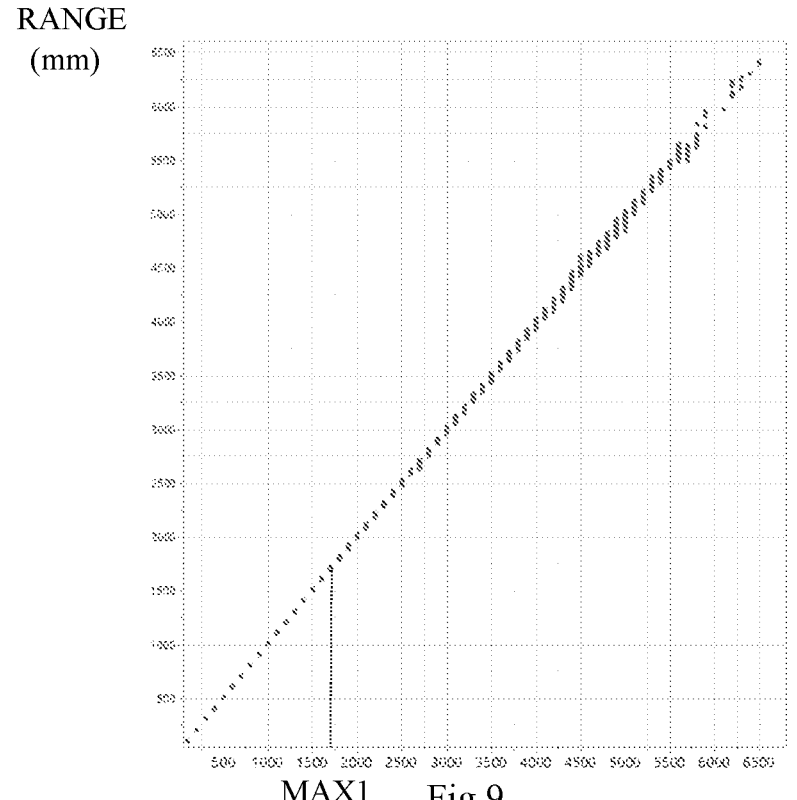
MAX1        Fig 9

METHOD AND DEVICE OF DISTANCE MEASUREMENT BY TIME-OF-FLIGHT CALCULATION WITH WRAPAROUND

CROSS-REFERENCE TO RELATED APPLICATIONS

This application claims priority to French Patent Application No. 2103215, filed on Mar. 29, 2021, which application is hereby incorporated by reference herein in its entirety.

TECHNICAL FIELD

The present disclosure generally relates to the field of distance measurements and, in particular embodiments, to time-of-flight calculation.

BACKGROUND

A device implementing a distance measurement based on calculating the time of flight, also called travel time, generally includes a light source emitting a light pulse in the image scene. The light reflected by any object located in the image scene is detected by photodetectors, for example, a SPAD array, and is used to determine the time of flight of the light pulse. The distance between the object and the device can then be deduced based on this time of flight.

The light pulses are generally emitted periodically, particularly to perform a plurality of successive measurements of the same time of flight and output a more accurate average value, which is in particular more robust with respect to the ambient light conditions.

Although a shorter period of the light pulse results in a higher number of measurements, as the period decreases, the maximum detection distance also decreases since the returned light pulse has less time to return before the emission of the next light pulse. Further, the returned pulse may be detected after the emission of the next light pulse and may be mistakenly taken as the return of the next light pulse, which results in erroneous distance measurements. Thus, a method and a device enabling, in a temporally high-performance manner, to measure a distance in a large distance range is advantageous.

SUMMARY

Embodiments of this disclosure overcome all or part of the disadvantages of known devices and methods for measuring the distance of an object based on a time of flight calculation.

One embodiment provides a method of measuring the distance between a device and an object comprising the steps of a) determination of a first estimated distance by the device based on the time of flight of first light pulses having a first period, b) determination of a second estimated distance by the device based on the time of flight of second light pulses having a second period different from the first period, c) determination of whether the device is in a wraparound area among wraparound areas by the device based on the interval ($\Delta R1$) being between the first and second estimated distances, and d) if the device is in a wraparound area among wraparound areas, adding to the first estimated distance of a compensation having its value depending on the wraparound area determined at step c).

According to an embodiment, at step d), if the device is not in a wraparound area among wraparound areas, no compensation is added to the first estimated distance.

According to an embodiment, at step d), the compensation values are looked for in a memory.

According to an embodiment, at step c), it is determined that the device is in a wraparound area among the wraparound areas, if the interval is between a pair of thresholds among pairs of thresholds.

According to an embodiment, the intervals delimited by the pairs of thresholds are distinct.

According to an embodiment, the thresholds of each pair of thresholds have the same sign.

According to an embodiment, the difference between the thresholds of each pair of thresholds is smaller than 500 mm.

According to an embodiment, at step c), if the absolute value of the interval is smaller than a minimum, it is determined that the device is not in a wraparound area among the wraparound areas.

According to an embodiment, the difference between the second period and the first period is greater than twice an internal clock period.

One embodiment also provides a device for measuring the distance of an object comprising a processing circuit configured to a) determining a first estimated distance based on the time of flight of first light pulses having a first period; b) determining a second estimated distance based on the time of flight of second light pulses having a second period different from the first period; c) determining, based on the interval between the first and second estimated distances, whether the device is in a wraparound area among wraparound areas; and d) if the device is in a wraparound area among wraparound areas, adding to the first estimated distance a compensation having its value depending on the wraparound area determined at step c).

According to an embodiment, the device further includes a memory having the compensation values stored therein.

According to an embodiment, the device further includes at least one array of SPAD cells.

According to an embodiment, the device further includes a light pulse generation circuit adapted to generate the first and second light pulses.

BRIEF DESCRIPTION OF THE DRAWINGS

For a more complete understanding of the present disclosure and the advantages thereof, reference is now made to the following descriptions taken in conjunction with the accompanying drawings, in which:

FIG. 8 is a flow diagram of an embodiment method of measurement; and

FIG. 9 is a plot of an embodiment set of measurements.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

Like features have been designated by like references in the various figures. In particular, the structural or functional features that are common among the various embodiments may have the same references and may dispose identical structural, dimensional and material properties.

For the sake of clarity, only the steps and elements that are useful for an understanding of the embodiments described herein have been illustrated and described in detail. In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Unless specified otherwise, the expressions "around," "approximately," "substantially," and "in the order of" signify within 10%, and preferably within 5%.

Although, in the present disclosure, embodiments where the distance measurement device includes a single-photon avalanche diode (SPAD) array are described, the principles of the device and of the method described herein for measuring a distance with respect to an object could be applied to any type of distance measurement device based on a time-of-flight estimate.

Figure 1:
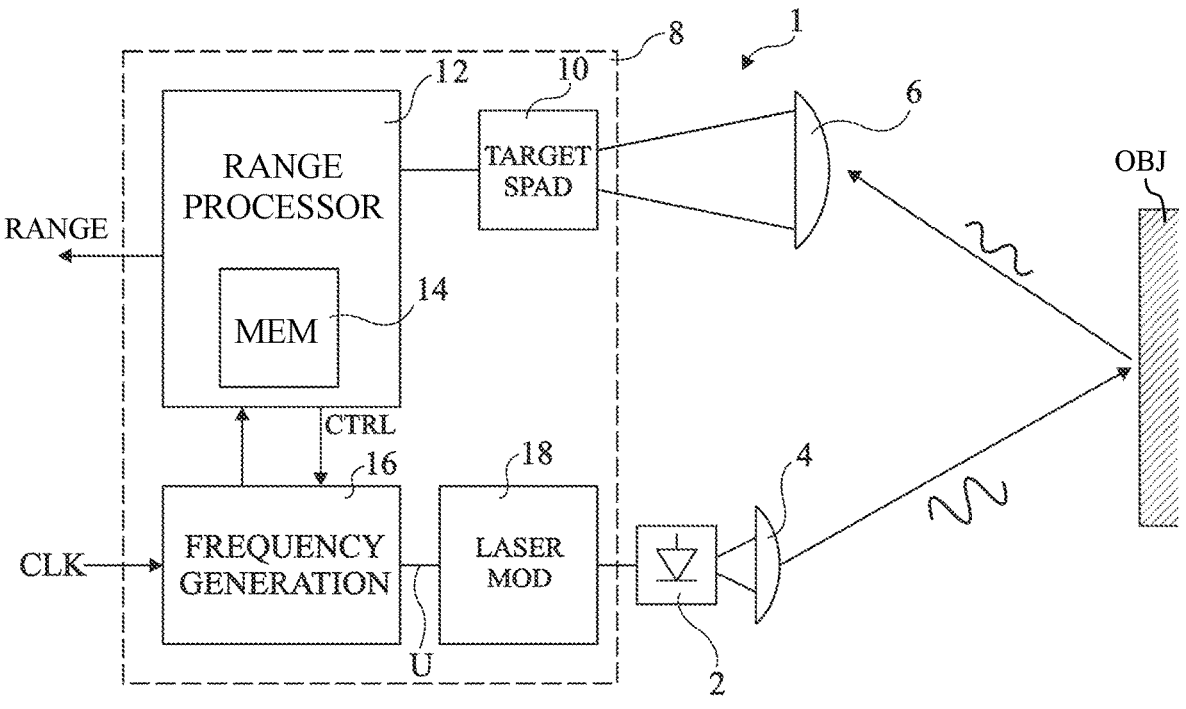
FIG. 1 is a schematic of an embodiment of a distance measurement device.

FIG. 1 illustrates a device 1 implementing a distance measurement function. Device 1 includes a light source 2, which is, for example, a laser, for emitting light pulses towards a scene, for example, via a lens 4. The returned light pulses are, for example, received via another lens 6.

Device 1 further includes a detection circuit 8 for determining the distance between device 1 and object OBJ located in the scene, having the light pulses reflecting against it. Detection circuit 8 includes a photodetector (TARGET SPAD) 10, for example, an array of single-photon avalanche diodes, or SPAD array, which receives, via lens 6, the returned light pulses. SPAD array 10, for example, includes an array including between 4 and a few hundred SPAD cells. In an example, array 10 is an array of 12 per 12 (i.e., 144 SPAD cells). The light pulses may correspond to visible light or infrared light.

In an embodiment, a distance determination circuit (RANGE PROCESSOR) 12 is coupled to, and estimates the delay between each emitted light pulse and the returned light pulse received by SPAD array 10, and determines an estimated distance between device 1 and object OBJ. Circuit 12 may include a processor configured to execute the instructions of a program or may include a dedicated electronic circuit. Circuit 12 may further include a memory 14 (MEM). Distance determination circuit 12 is adapted to delivering a signal RANGE representative of the estimated distance between device 1 and object OBJ. Detection circuit 8 also, for example, includes a frequency generation circuit (FREQUENCY GENERATION) 16, which generates a voltage signal U delivered to a laser modulation circuit (LASER MOD) 18 to generate a signal for driving light source 2. Distance determination circuit 12, for example, delivers a control signal CTRL to frequency generation circuit 16 to control the period of signal U.

An example of a method of detecting the light pulses returned by SPAD array 10 is in particular described in document US10094915B2, which is incorporated herein by reference in its entirety.

As an example, the detection circuit 8 may further include a reference SPAD array, which for example has the same dimensions as SPAD array 10, and which receives an internal reflection of the emitted light pulses and distance determination circuit 12 is adapted to comparing the delay between each emitted light pulse and the returned light pulse received by SPAD array 10 and the delay between each emitted light pulse and the returned light pulse received by the reference SPAD array and of deducing therefrom the estimated distance between device 1 and object OBJ.

Figure 2:
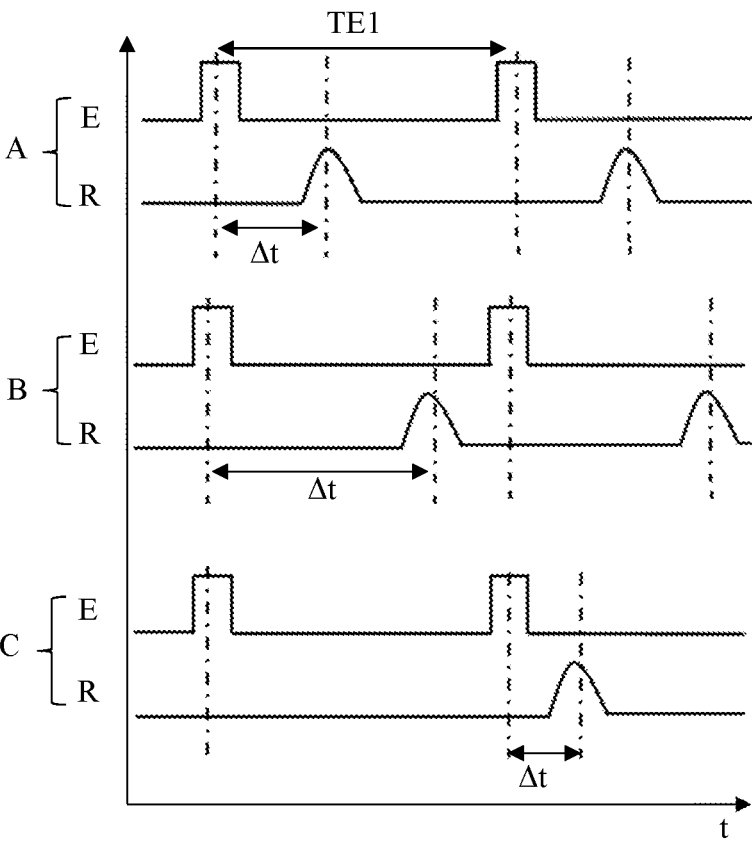
FIG. 2 is a timing diagram for an embodiment of light pulses.
Figure 3:
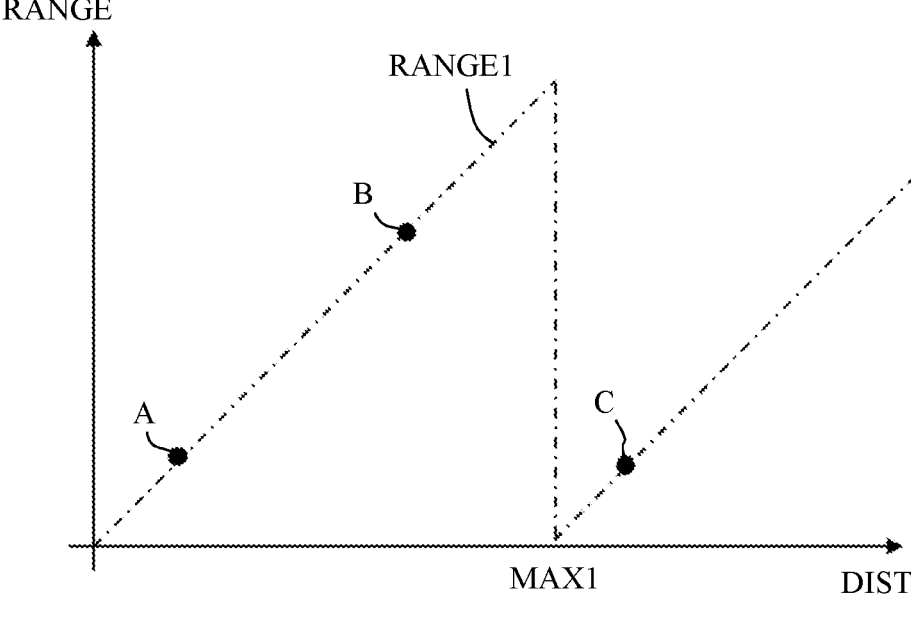
FIG. 3 is a plot of an embodiment set of measurements.

FIG. 2 shows timing diagrams of the light signal E emitted by source 2 and of the light signal R captured by photodetector 10 for three different values of the real distance between object OBJ and the device 1 of FIG. 1, and FIG. 3 shows in stripe-dot lines a curve RANGE1 of variation of the estimated distance RANGE between the device 1 of FIG. 1 and object OBJ such as determined by device 1 according to the real distance DIST between device 1 and object OBJ.

Signal E includes light pulses of period TE1 The period of the light pulses emitted by light source 102 is equal to the period of the electric signal U delivered to control light source 2. In the example of FIG. 2, signal E is a square wave signal. However, in alternative embodiments, the signal U used to generate the light pulses, and the actual pulses of signal E, might take other shapes. For example, signal E might form a continuous sine wave signal, having peaks that correspond to the light pulses, and valleys where the light signal falls to zero. In such a case, the period of the light pulses would be the period of the sine wave. In other examples, signal E might have the shape of triangular waves or a sawtooth shape where the peaks form the light pulses.

Curve RANGE1 has a general sawtooth shape. The points of curve RANGE1 respectively corresponding to the two top curves, to the two middle curves, and to the two bottom curves in the left-hand portion of FIG. 2 have been indicated with references A, B, and C.

As shown in FIGS. 2 and 3, as long as the time period $\Delta t$ between the returned pulse of signal R and the corresponding emitted pulse of signal E is shorter than period TE1, that is, as long as the real distance DIST remains shorter than a maximum distance MAX1, as is the case for points A and B in FIG. 3, the estimated distance RANGE determined by device 1 is in accordance with real distance DIST. However, when the time period $\Delta t$ between the returned pulse of signal R and the corresponding emitted pulse of signal E is longer than period TE1, that is, when the real distance DIST exceeds threshold MAX1, as is the case for point C in FIG. 3, the returned light pulse reaches photodetector 10 after the emission of the next light pulse, whereby the estimated distance RANGE determined by device 1 does not correspond to the real distance DIST. The area over which the estimated distance RANGE determined by device 1 does not correspond to the real distance DIST is called a wraparound area.

Figure 4:
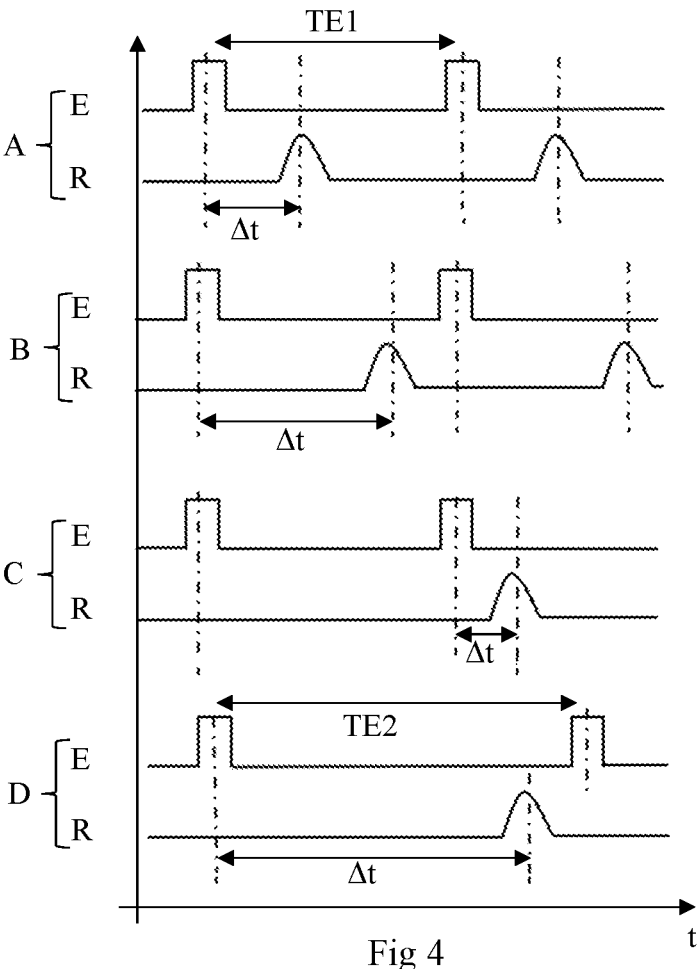
FIG. 4 is a timing diagram for an embodiment of light pulses.
Figure 5:
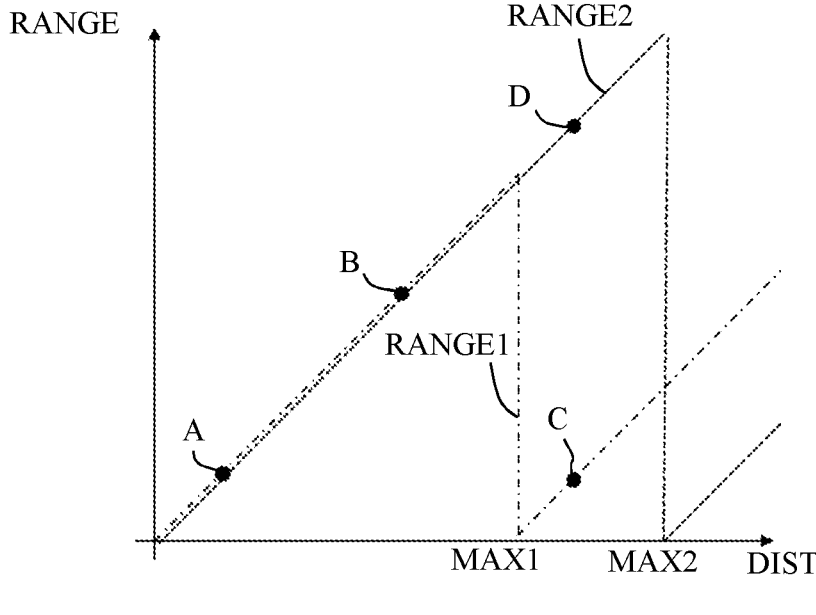
FIG. 5 is a plot of an embodiment set of measurements.

FIGS. 4 and 5 are drawings respectively similar to FIGS. 2 and 3 for two different periods TE1 and TE2 of the light pulses emitted by the device 1 of FIG. 1. More particularly, FIG. 5 shows curves of variation of the estimated distance RANGE determined by device 1 according to the real distance DIST, respectively in stripe-dot lines (curve RANGE1) for the first period TE1 and in dotted lines (curve RANGE2) for the second period TE2, longer than first period TE1, and FIG. 4 shows the timing diagrams of the signals E and R of FIG. 2 for period TE1 as well as the timing diagrams of signals E and R corresponds to the point D of curve RANGE2.

Curves RANGE1 and RANGE2 each have a general sawtooth shape and are partly superimposed. Curves RANGE1 and RANGE2 are superimposed particularly for points A and B. Period TE2 being longer than period TE1 the maximum distance MAX2 beyond which the estimated distance RANGE delivered by device 1 is no longer in accordance with the real distance DIST is greater than distance MAX1. This is the case for point D of curve RANGE2, which corresponds to the same real distance as the point C of curve RANGE1 but at different estimated distances.

It would seem to be desirable to increase the period of the light pulses as much as possible to increase the maximum distance below which the estimated distance supplied by device 1 is in accordance with the real distance. It would, however, be desirable for device 1 to determine a plurality of successive values of delay Δt, or of the corresponding estimated distance RANGE to determine the average, for example, the arithmetical average or any other average calculation, of the obtained values to increase the accuracy of the result, and particularly to do away with the variabilities of the ambient light conditions. Thereby, an increase in the period of the light pulses causes a decrease in the number of determinable values and thus a decrease in the accuracy of the delivered averaged value.

Figure 6:
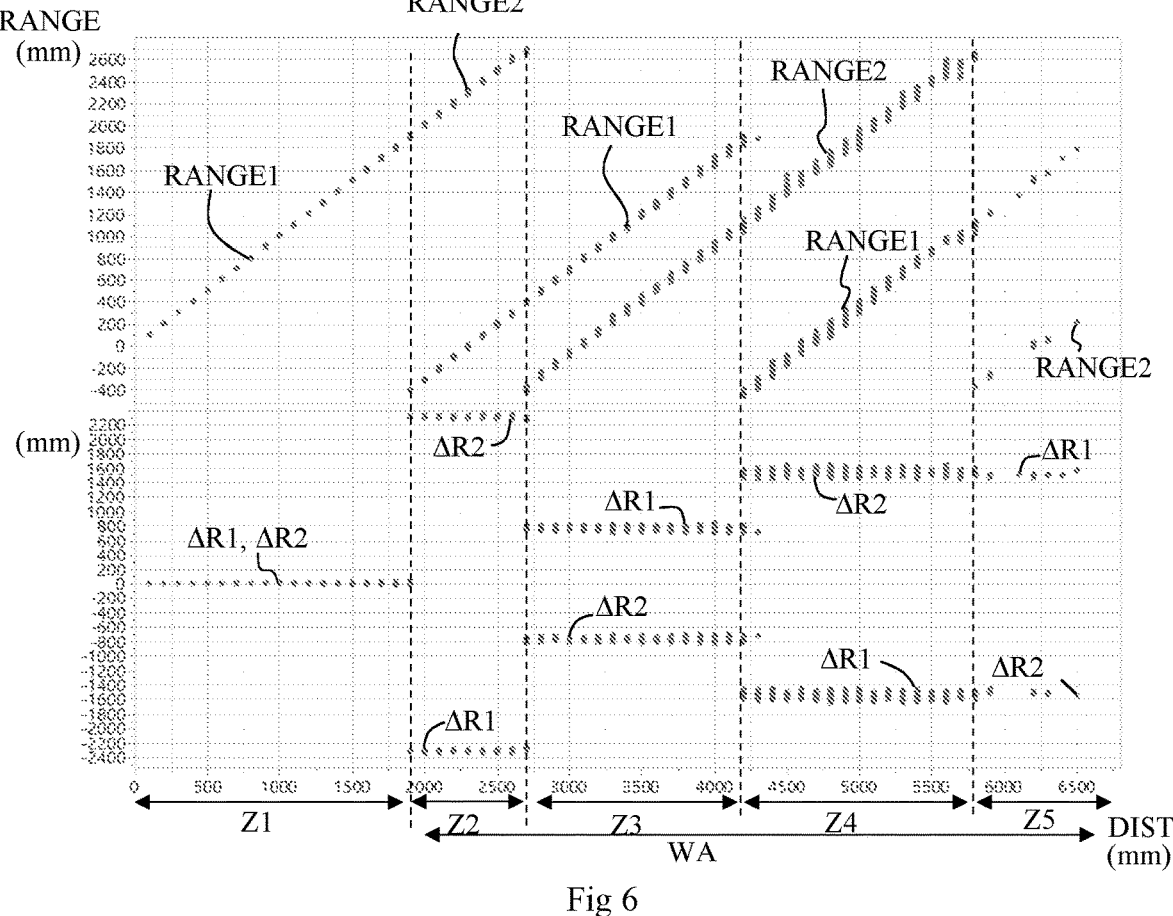
FIG. 6 is a plot of an embodiment set of measurements.

FIG. 6 shows, in its upper portion, the values obtained by testing of the curves RANGE1 and RANGE2 of FIG. 3 by the varying of the real distance DIST between object OBJ and device 1 with a 100 mm pitch, and, in its lower portion, the interval ΔR1 between estimated distance RANGE1 and estimated distance RANGE2 and the interval ΔR2 between estimated distance RANGE2 and estimated distance RANGE1. For these tests, period TE1 was equal to 20 times the internal clock period, and period TE1 was equal to 24 times the internal clock period.

As shown in FIG. 6, each interval ΔR1 and ΔR2 takes constant values over successive ranges or areas of real distance DIST, the values taken on the different areas being different. Further, intervals ΔR1 and ΔR2 are substantially equal in absolute value and of opposite signs. As an example, in FIG. 6, substantially five successive areas Z1, Z2, Z3, Z4, and Z5 of real distance DIST over which each interval ΔR1 and ΔR2 takes constant values can be distinguished. In practice, the limits of the areas and the number of areas will particularly depend on periods TE1 and TE2. Beyond a certain distance between device 1 and object OBJ, which particularly depends on the ambient light conditions, the photodetector no longer succeeds in capturing the returned pulses so that the determination of an estimated distance is no longer possible.

Curve RANGE1 exhibits a continuous ramp over area Z1, a continuous ramp over areas Z2 and Z3, and a continuous ramp over areas Z4 and Z5. Curve RANGE2 exhibits a continuous ramp over areas Z1 and Z2, a continuous ramp over areas Z3 and Z4, and a continuous ramp over area Z5. Over area Z1, intervals ΔR1 and ΔR2 are substantially equal to zero and are different from zero over areas Z2, Z3, Z4, and Z5. The total wraparound area WA of device 1 corresponds to the area where intervals ΔR1 and ΔR2 are different from zero, that is, to all the wraparound areas Z2, Z3, Z4, and Z5 in the example of FIG. 6.

In embodiments, over area Z2, interval ΔR1 is substantially equal to −2,300 mm, and interval ΔR2 is substantially equal to 2,300 mm.

In embodiments, over range Z3, interval ΔR1 is substantially equal to 600 mm, and interval ΔR2 is substantially equal to −600 mm.

In embodiments, over area Z4, interval ΔR1 is substantially equal to −1,600 mm, and interval ΔR2 is substantially equal to 1,600 mm.

In embodiments, over area Z5, interval ΔR1 is substantially equal to 1,600 mm, and interval ΔR2 is substantially equal to −1,600 mm.

Figure 7:
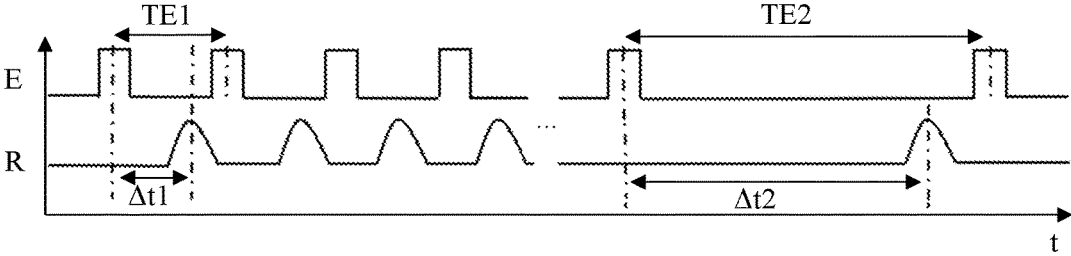
FIG. 7 is a timing diagram for an embodiment of light pulses.

FIG. 7 shows timing diagrams of the emitted and returned light pulses E and R according to an embodiment of a method of determination of an estimated distance by the device 1 shown in FIG. 1.

According to the present embodiment, the distance determination circuit 12 is configured to control frequency generation circuit 16 to cyclically generate an alternation of the first group of light pulses of signal E at a first period TE1 and the second group of light pulses of signal E at a second period TE2, longer than first period TE1 According to an embodiment, first period TE1 varies from 8 times the internal clock period to 20 times the internal clock period, and second period TE2 varies from 12 times the internal clock period to 24 times the internal clock period. According to an embodiment, the difference between second period TE2 and first period TE1 is greater than twice the internal clock period and particularly varies from twice the internal clock period to 10 times the internal clock period.

Circuit 12 determines for each first group a first estimated distance RANGE1 and for each first group a second estimated distance RANGE2.

FIG. 8 illustrates, in a block diagram, an embodiment of a method of determination of an estimated distance RANGE by the device 1 shown in FIG. 1.

At step 20, circuit 12 determines the estimated distances RANGE1 and RANGE2 from the first and second groups of pulses at periods TE1 and TE2. In particular, each estimated distance RANGE1 and RANGE2 may correspond to an average obtained from a plurality of distance values. The method carries on at step 21.

At step 21, circuit 12 determines whether the estimated distance RANGE1 is in the wraparound area WA of device 1. For this purpose, circuit 12 may compare the absolute value of the difference between estimated distances RANGE1 and RANGE2 with a threshold.

In an embodiment, if the absolute value of the difference between estimated distances RANGE1 and RANGE2 is smaller than the threshold, this means that the estimated distance RANGE1 is not in wraparound area WA, and thus with all the more reason that the estimated distance RANGE2 is not in wraparound area WA.

At step 25, if the absolute value of the difference between the estimated distances RANGE1 and RANGE2 is greater than the threshold, the estimated distance RANGE1 is in wraparound area WA.

At step 22, as a variant, circuit 12 may compare estimated distance RANGE1 with the maximum distance MAX1 such as defined for period TE1 If the estimated distance RANGE1 is shorter than maximum distance MAX1, the estimated distances RANGE1 and RANGE2 are not in wraparound area WA. If the estimated distance RANGE1 is greater than maximum distance MAX1, the estimated distance RANGE1 is in wraparound area WA.

At step 22, circuit 12 determines the interval ΔR1 corresponding to the difference between estimated distance RANGE1 and estimated distance RANGE2 or the interval ΔR2 corresponding to the difference between estimated distance RANGE2 and estimated distance RANGE1. The method then carries on at step 23.

At step 23, circuit 12 determines the portion Z2, Z3, Z4, or Z5 of the wraparound area WA where device 1 is located. This may be done by comparing interval ΔR1 with successive thresholds to determine the portion Z2, Z3, Z4, or Z5 of wraparound area WA where device 1 is located. According to an embodiment, circuit 12 determines whether interval ΔR1 is between thresholds THMIN_Z2 and THMAX_Z2.

If interval ΔR1 is between thresholds THMIN_Z2 and THMAX_Z2, this means that device 1 is in area Z2, and the method carries on at step 24. If interval ΔR1 is not between thresholds THMIN_Z2 and THMAX_Z2, this means that device 1 is not in area Z2. Circuit 12 then determines whether interval ΔR1 is between thresholds THMIN_Z3 and THMAX_Z3.

If interval ΔR1 is between thresholds THMIN_Z3 and THMAX_Z3, this means that device 1 is in area Z3, and the method carries on at step 24.

If interval ΔR1 is not between thresholds THMIN_Z3 and THMAX_Z3, this means that device 1 is not in area Z3. The operation is repeated for areas Z4 and Z5.

Generally, circuit 12 determines that device 1 is in area Zi, i being greater than 2, if interval ΔR1 is between thresholds THMIN_Zi and THMAX_Zi, which depend on area Z. Thresholds THMIN_Zi and THMAX_Z1 have the same sign.

According to an embodiment, the difference between thresholds THMIN_Zi and THMAX_Zi is smaller than 500 mm. If it is finally determined that device 1 is not in any of areas Z2, Z3, Z4, and Z5, the method carries on at step 26.

At step 24, device 1 determines a compensation value to be added to estimated distance RANGE1 and which depends on the area Z2, Z3, Z4, or Z5 where device 1 is located. These values may be determined in a previous step of calibration of device 1 and stored in the memory 14 of device 1.

In embodiments, the compensation values may be stored in the form of a lookup table, circuit 12 polling this table with an identifier of the area Z1, Z2, Z3, Z4, or Z5 determined at step 23 and the lookup table returning the compensation value associated with this area. As an example, for area Z1, i being a natural integer greater than or equal to 2, the compensation value over this area Z1 may be equal to the sum of the absolute values of interval ΔR1 over areas Z2 to Z1. The method carries on at step 25.

At step 25, circuit 15 delivers the estimated distance RANGE1, corrected if need be with the compensation value. The method may carry on at step 20 by the determination of new estimated distances RANGE1 and RANGE2.

At step 26, circuit 12 may deliver an error message indicating that the determination of an estimated distance is not possible.

In the previously described embodiment, circuit 12 uses estimated distances RANGE1 and RANGE2. As a variant, the method may be implemented by directly using delays Δt1 and Δt2, that is, before the determination of estimated distances, the compensation values then being capable of corresponding to delay values, and the estimated distance being determined with the corrected delay.

FIG. 9 shows the estimated distance RANGE obtained by testing in the same conditions as FIG. 6, on implementation of the estimated distance determination method of FIG. 8.

When the estimated distance determination method of FIG. 8 is implemented, the maximum distance to be measured by device 1 is approximately 6,500 mm. The maximum distance MAX1 capable of being measured with the pulses of period TE1 when the embodiment of the previously-described method is not implemented is approximately 1,700 mm. The maximum distance capable of being correctly measured by device 1 is thus increased. Further, since the estimated distances used values obtained from the light pulses at period TE1, the uncertainty of the estimated distance is decreased and the robustness with respect to the ambient light conditions is improved.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

It is understood that the embodiments of this disclosure are not limited to applications disclosed herein regarding the measurement of a voltage drop at a reserve capacitor in a supplemental restraint system. The various embodiments are also applicable to other applications that benefit from measuring a voltage drop at a terminal of an electronic circuit having an unknown baseline voltage.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for measuring a distance between a device and an object, the method comprising:
  determining a first estimated distance between the device and the object based on time-of-flight measurements of a first set of light pulses having a first period;
  determining a second estimated distance between the device and the object based on time-of-flight measurements from a second set of light pulses having a second period different from the first period;
  determining whether the device is in a wraparound area among wraparound areas based on an interval between the first estimated distance and the second estimated distance, wherein determining whether the device is in the wraparound area among the wraparound areas comprises determining that the interval is between a pair of thresholds among a set of pairs of thresholds; and
  adding a compensation value to the first estimated distance based on the device being in the wraparound area among the wraparound areas, the compensation value being in accordance with the wraparound area.

2. The method of claim 1, further comprising maintaining a value of the first estimated distance based on the device not being in the wraparound area among the wraparound areas.

3. The method of claim 1, further comprising looking up the compensation value in a memory of the device.

4. The method of claim 1, wherein intervals delimited by the pairs of thresholds are distinct.

5. The method of claim 1, wherein each of the pairs of thresholds have a same sign.

6. The method of claim 1, wherein a difference between each of the pairs of thresholds is less than 500 mm.

7. The method of claim 1, wherein the device is not in the wraparound area among the wraparound areas based on an absolute value of the interval being smaller than a minimum value.

8. The method of claim 1, wherein a difference between the second period and the first period is greater than twice an internal clock period.

9. A device for measuring a distance between the device and an object, the device comprising:

a non-transitory memory storage comprising instructions; and a processor coupled to the non-transitory memory storage, the instructions when executed by the processor, cause the processor to:

determine a first estimated distance between the device and the object based on time-of-flight measurements of a first set of light pulses having a first period, determine a second estimated distance between the device and the object based on a time-of-flight measurements from a second set of light pulses having a second period different from the first period, determine whether the device is in a wraparound area among wraparound areas based on an interval between the first estimated distance and the second estimated distance, wherein instructions to determine whether the device is in the wraparound area among wraparound areas comprise instructions to determine that the interval is between a pair of thresholds among a set of pairs of thresholds, and add a compensation value to the first estimated distance based on the device being in the wraparound area among the wraparound areas, the compensation value being in accordance with the wraparound area.

10. The device of claim 9, wherein the compensation value is stored in the non-transitory memory storage.

11. The device of claim 9, further comprising an array of single-photon avalanche diode (SPAD) cells.

12. The device of claim 9, further comprising a light pulse generation circuit configured to generate the first set of light pulses and the second set of light pulses.

13. A non-transitory computer-readable media storing computer instructions for measuring a distance between a device and an object, that when executed by a processor, cause the processor to:

determine a first estimated distance between the device and the object based on time-of-flight measurements of a first set of light pulses having a first period;

determine a second estimated distance between the device and the object based on time-of-flight measurements from a second set of light pulses having a second period different from the first period;

determine whether the device is in a wraparound area among wraparound areas based on an interval between the first estimated distance and the second estimated distance, wherein causing the processor to determine whether the device is in the wraparound area among the wraparound areas causing the processor to determine that the interval is between a pair of thresholds among a set of pairs of thresholds; and add a compensation value to the first estimated distance based on the device being in the wraparound area among the wraparound areas, the compensation value being in accordance with the wraparound area.

14. The non-transitory computer-readable media of claim 13, wherein the instructions when executed by the processor, cause the processor to maintain a value of the first estimated distance based on the device not being in the wraparound area among the wraparound areas.

15. The non-transitory computer-readable media of claim 13, wherein the instructions when executed by the processor, cause the processor to look up the compensation value in a memory of the device.

16. The non-transitory computer-readable media of claim 13, wherein intervals delimited by the pairs of thresholds are distinct.

17. The non-transitory computer-readable media of claim 13, wherein the device is not in the wraparound area among the wraparound areas based on an absolute value of the interval being smaller than a minimum value.

* * * * *